(12) United States Patent
Sousa et al.

(10) Patent No.: US 6,348,358 B1
(45) Date of Patent: Feb. 19, 2002

(54) EMITTER ARRAY WITH INDIVIDUALLY ADDRESSABLE LASER DIODES

(75) Inventors: John Gary Sousa, Hudson; Josh P. Foster, Windham, both of NH (US); Thomas C. Dearman, Oro Valley, AZ (US)

(73) Assignee: Presstek, Inc., Hudson, NH (US)

( * ) Notice: Subject to any disclaimer, the term of this patent is extended or adjusted under 35 U.S.C. 154(b) by 0 days.

(21) Appl. No.: 09/484,992

(22) Filed: Jan. 18, 2000

Related U.S. Application Data

(60) Provisional application No. 60/120,941, filed on Feb. 19, 1999.

(51) Int. Cl.⁷ .............................................. H01L 21/00
(52) U.S. Cl. .............................. 438/22; 438/26; 438/33; 438/456
(58) Field of Search .............................. 438/22, 23, 24, 438/25, 26, 28, 29, 33, 34, 35, 455, 456, 464

(56) References Cited

U.S. PATENT DOCUMENTS

| | | | | |
|---|---|---|---|---|
| 5,319,725 A | * | 6/1994 | Buchamann et al. | ......... 385/14 |
| 5,521,932 A | * | 5/1996 | Marshall | ....................... 372/36 |
| 5,861,992 A | | 1/1999 | Gelbart | ........................ 359/619 |
| 5,880,525 A | * | 3/1999 | Boudreau et al. | ........... 257/752 |
| 5,912,872 A | * | 6/1999 | Feldman et al. | ............ 369/112 |
| 5,986,819 A | | 11/1999 | Steinblatt | ..................... 359/663 |

FOREIGN PATENT DOCUMENTS

| | | |
|---|---|---|
| EP | 0 590 232 | 4/1994 |
| JP | 57 005 381 | 1/1982 |
| JP | 60 211 992 | 10/1985 |
| JP | 61 168 283 | 7/1986 |
| WO | 96 249 70 | 8/1996 |

* cited by examiner

*Primary Examiner*—Savitri Mulpuri
(74) *Attorney, Agent, or Firm*—Testa, Hurwitz & Thibeault, LLP

(57) ABSTRACT

A linear array of diode laser emitters is manufactured with sufficient thermal and electronic isolation among the emitters to permit separate addressability. The emitter bar has first and second opposed surfaces and a third surface through which the emitters direct output. A first surface of the emitter bar is affixed to a "standoff" element that has conductive surfaces connecting each emitter to a power source; these connections are maintained after a series of spaces is formed between the emitters of the emitter bar. The second surface of the emitter bar is affixed to a heat sink to form a finished assembly.

9 Claims, 3 Drawing Sheets

EMITTER ARRAY WITH INDIVIDUALLY ADDRESSABLE LASER DIODES

RELATED APPLICATION

This application stems from U.S. Ser. No. 60/120,941, filed on Feb. 19, 1999.

FIELD OF THE INVENTION

The present invention relates to laser diodes, and in particular to the construction and operation of emitter arrays.

BACKGROUND OF THE INVENTION

Although diode lasers are presently available in linear arrays, or "bars," the individual emitters are not separately addressable; that is, the lasers must all be on or off. This is due to the thermal and electronic interaction that inevitably results from containment within a single solid structure. "Crosstalk" causes operation of one device to affect nearby devices, thereby producing mutual interference. Accordingly, the current state of the art precludes individual operation of the lasers in a single diode bar; simultaneous device operation ordinarily entails electrically and physically separate devices.

A need therefore exists for multiple-device packages that have closely spaced diodes, but which also permit independent operation of the individual lasers.

DESCRIPTION OF THE INVENTION

Brief Summary of the Invention

The present invention achieves sufficient thermal and electronic isolation among the emitters in a diode bar to permit separate addressability. In accordance with the invention, a laser emitter bar comprises first and second opposed, parallel surfaces each perpendicular to a third surface through which a plurality of emitters direct output. A first surface of the emitter bar is affixed to a "standoff" element that has conductive surfaces connecting each emitter to a power source; these connections are maintained after a series of spaces is formed between the emitters of the emitter bar. The spaces are sufficient (generally 200 μm to 1000 μm) to ensure the absence of crosstalk among the emitters. The second surface of the emitter bar is then affixed to a heat sink to form a finished assembly.

In light of their separate addressability, two emitters in a single package may have different output power levels to facilitate, for example, production of image spots having different sizes.

BRIEF DESCRIPTION OF THE DRAWINGS

The foregoing discussion will be understood more readily from the following detailed description of the invention, when taken in conjunction with the accompanying drawings, in which.

DETAILED DESCRIPTION OF THE PREFERRED EMBODIMENTS

Figure 1:
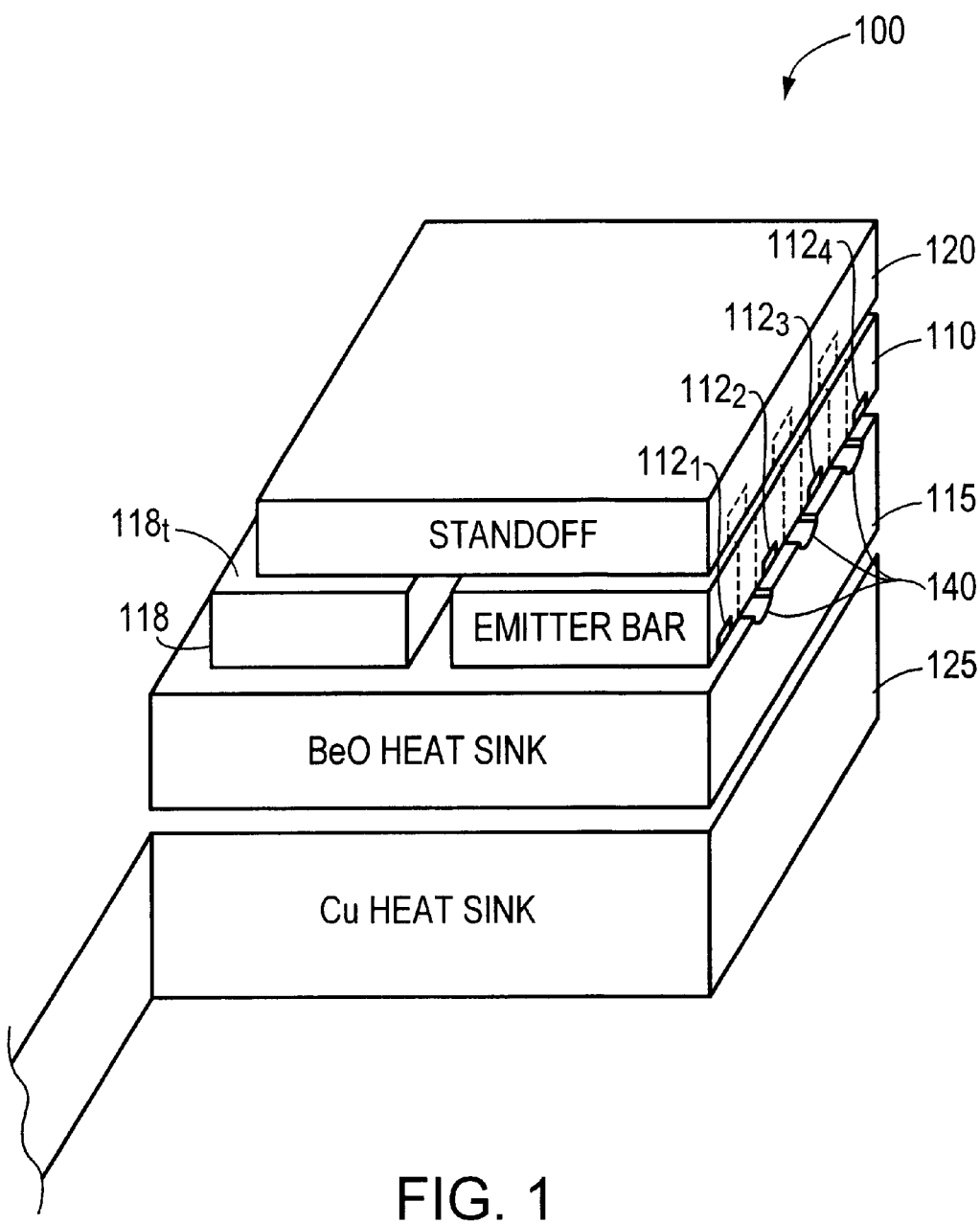
FIG. 1 is a slightly exploded view of the components of an emitter bar amenable to processing in accordance with the invention.

A representative implementation of the invention, applied to a four-emitter bar, is shown in FIG. 1. The depicted structure 100 comprises the emitter bar 110, which supports four collinear diode emitters $112_1$, $112_2$, $112_3$, $112_4$. The emitter bar 110 is soldered onto a beryllium oxide (BeO) heat sink 115 as described in greater detail below. An element 118 is also soldered to BeO heat sink 115. The top surfaces of emitter bar 110 and element 118 are coplanar, and a standoff element 120 is soldered thereto. BeO heat sink 115 is itself soldered to a larger T-shaped fixture 125, which is preferably copper and itself acts as a heat sink.

Figure 2:
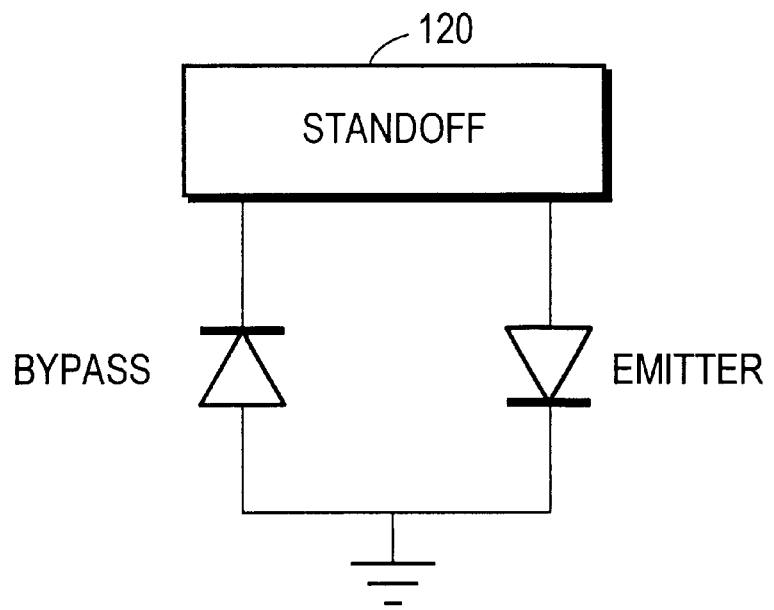
FIG. 2 schematically illustrates the electronic relationship among the operative components shown in FIG. 1.

In one embodiment, element 118 is a bypass chip, and emitter bar 110 and element 118 function as oppositely biased diodes connected to standoff element 120 as shown in FIG. 2. Current is delivered to emitters 112 through metallized surfaces on the top of element 118 and the bottom of standoff element 120. Element 118 receives electrical connections from suitable laser driver circuits, and as a bypass chip, prevents reverse loading through the diode emitters. In addition to providing electrical connection between the top surface 118t of element 118 and the top surface of emitter bar 110, standoff element 120—which may be alumina—also provides mechanical anchorage to facilitate the cutting operations described below.

Element 118 has a metallized bottom surface that is electrically connected to a corresponding metallized surface on the bottom of emitter bar 110 by means of solder on the top surface of heat sink 115, providing the element 118 and the emitter 110 with a common ground to one polarity of the laser driver.

If reverse bias is not likely, element 118 may be a block of dielectric material (e.g., alumina) metallized with a pattern of thin, spaced-apart strips disposed across the bottom and top surfaces of the block and having negligible area (so as to minimize capacitive coupling across emitter bar 110). The conductive strips are arranged so as to conform to the contacts for emitters 112.

Figure 3:
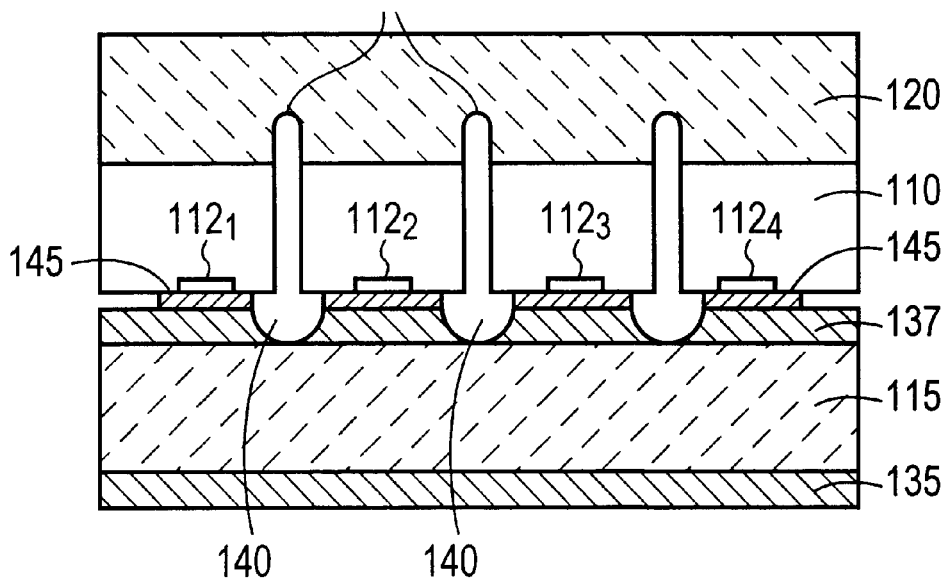
FIG. 3 is a sectional view of the finished assembly following processing.

FIG. 3 shows more precisely the nature of the separation and the manner in which it is achieved. The emitters 112 are physically separated by a series of saw cuts (which follow generally the paths indicated by dashed lines in FIG. 1), and the cuts continue into the standoff element 120 to form a series of grooves therein. In particular, the grooves extend through the conductive lower surface of standoff element 120 and into its dielectric bulk, thereby forming electrically separate conductive traces divided by the grooves.

In accordance with the invention, emitter bar 110 and element 118 (not shown in FIG. 3) are first soldered into place on standoff element 120. Then, a diamond saw physically separates the emitters by making a series of three cuts 130 that extend completely through the emitter bar 110 and the conductive lower surface of standoff element 120. Formation of the cuts 130 does not distort the dimensional integrity of any of the components or their relative positions. If the centers of emitters 112 are spaced 1 mm apart from each other, the gaps between emitters 112 imposed by the cuts are desirably 0.076 mm to 0.152 mm thick.

With continued reference to FIG. 3, the opposed surfaces 135, 137 of BeO heat sink 115 are layers of epitaxially deposited metal (typically gold). Layer 137 is deposited on a surface that is partially masked so as to form three longitudinal channels 140 extending across the width of BeO heat sink 115. These channels are then aligned with cuts 130 when emitter bar 110 is affixed to BeO heat sink 115, and serve to maintain physical separation between emitters 112. The alignment is accomplished as follows. Four strips of solder preform, each narrower than the space between channels 140, are placed on the top of metal layer 137, two between channels 140 and two alongside the end channels. Emitter bar 110 is then placed against these solder preforms, which are then heated to form a series of solder bonds 145 between layer 137 and emitter bar 110.

Figure 4:
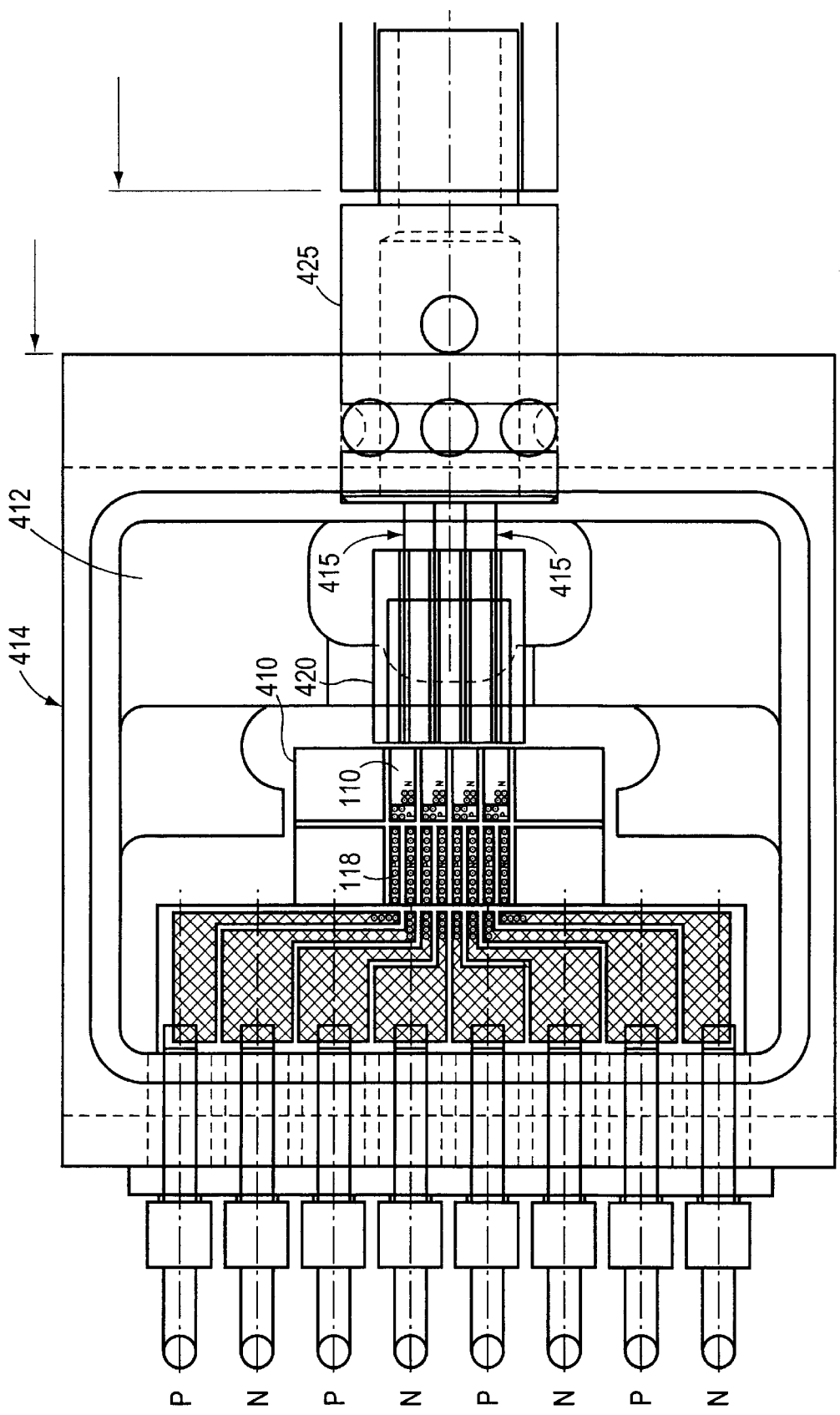
FIG. 4 is a plan view of a representative environment for an emitter bar fabricated in accordance with the present invention.

FIG. 4 illustrates an application of the invention. Emitter bar 110 and element 118, with standoff element 120 thereabove (but not shown in FIG. 4) are carried on a table 410, which rises from the floor of a cavity 412 within a metal device carrier 414. A series of optical fibers 415, carried in a grooved bench 420 whose surface is coplanar with that of emitter bar 110, are optically coupled at one end to the emitters 112. The optical fibers 415 extend into a coupling 425, which surrounds a cable that carries fibers 415 to a destination (generally a focusing assembly). Current is supplied to the emitters 112 through a series of pins labeled P, N. These pins are electrically connected to element 118 through a series of gold traces and fine gold wires, according to conventional practice, and current applied to any pair of pins reaches the associated emitter (via standoff element 120) but not adjacent emitters, owing to the interruptions in the conductive surface of element 118. For example, in the case of a bypass chip, cuts 130 and channels 140 form a series of lanes within the conductive surface of the bypass chip, thereby creating the separate conductive fingers as illustrated. In the case of a dielectric block, the conductive surfaces may be initially applied in the form of fingers as described above.

The emitters 112 may, if desired, have different output levels. For example, emitters 112 can be organized in sets, with each member of a set producing a different output power level. For example, emitters $112_1$, $112_3$ may have a higher output level than emitters $112_2$, $112_4$; in this way, each high-power/low-power pair of emitters can be optically directed toward a single image location, and a desired output fluence directed thereto merely by selection of the proper emitter. This capability is useful, for example, in imaging systems that allow for application of differently sized image spots, with the size of the spot being determined by the applied fluence level.

Different output fluences can be achieved in various ways, the most obvious being use of emitter elements designed with distinctly different intrinsic characteristics that cause them to emit at different output power levels (with the same applied current). For example, the different emitters may have optical cavities of different lengths. It should be noted, however, that such emitters can always be biased with different amounts of current to cause them to output at similar fluence levels where appropriate.

One can also individually focus the outputs of two emitters having different aperture sizes so they form spots of the same size on the recording medium. Since the power from a larger-apertured emitter will be greater, in proportion to the increased aperture area, than the power from a smaller-apertured emitter, the result is two spots with different fluences.

It will therefore be seen that we have developed a novel approach toward obtaining independent control of multiple-diode laser devices. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of manufacturing a laser emitter bar assembly, the method comprising the steps of:
   a. providing an emitter bar comprising a plurality of laser emitters, the bar having first and second opposed surfaces and a third surface through which the emitters direct output;
   b. providing a standoff element having a surface at least a portion of which is conductive and connectable to a power source;
   c. affixing the first surface of the emitter bar to the conductive surface of the standoff element;
   d. without separating the emitter bar from the standoff element, forming spaces between the emitters of the emitter bar;
   e. affixing the second surface of the emitter bar to a heat sink;
   f. providing a bypass element having a conductive surface, a second surface opposed thereto and terminals for connection to a power source;
   g. affixing the conductive surface of the bypass element to the conductive surface of the standoff element, thereby establishing electrical connections between the bypass-element terminals and emitters; and
   h. affixing the second surface of the bypass element to the heat sink.

2. The method of claim 1 wherein the standoff element has a nonconductive body and the spaces between the emitters extend into the body of the standoff element, severing the conductive surface into a series of electrically distinct regions.

3. The method of claim 2 wherein the spaces between the emitters are formed by sawing through the emitter bar and into the standoff element.

4. The method of claim 1 wherein the spaces are at least 0.076 mm thick.

5. The method of claim 1 wherein the bypass element is a rectifier that prevents reverse bias through the emitters.

6. The method of claim 1 further comprising the steps of:
   a. providing a dielectric element having first and second opposed conductive surfaces and terminals for connection to a power source;
   b. affixing a surface of the dielectric element to the conductive surface of the standoff element, thereby establishing electrical connections between the dielectric-element terminals and the emitters; and
   c. affixing the other surface of the dielectric element to the heat sink.

7. The method of claim 1 wherein the heat sink comprises a series of grooves aligned with the spaces.

8. The method of claim 1 wherein the heat sink is beryllium oxide.

9. The method of claim 1 wherein the emitters are organized into sets, the emitters of each set having different output levels.

* * * * *